United States Patent
Darmawikarta et al.

(10) Patent No.: US 11,948,898 B2
(45) Date of Patent: Apr. 2, 2024

(54) ETCH BARRIER FOR MICROELECTRONIC PACKAGING CONDUCTIVE STRUCTURES

(71) Applicant: Intel Corporation, Santa Clara, CA (US)

(72) Inventors: Kristof Darmawikarta, Chandler, AZ (US); Srinivas V. Pietambaram, Chandler, AZ (US); Hongxia Feng, Chandler, AZ (US); Xiaoying Guo, Chandler, AZ (US); Benjamin T. Duong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1130 days.

(21) Appl. No.: 16/413,943

(22) Filed: May 16, 2019

(65) Prior Publication Data
US 2020/0365534 A1     Nov. 19, 2020

(51) Int. Cl.
*H01L 23/66* (2006.01)
*H01L 21/768* (2006.01)
*H01L 23/528* (2006.01)
*H01L 23/532* (2006.01)

(52) U.S. Cl.
CPC ........ *H01L 23/66* (2013.01); *H01L 21/76825* (2013.01); *H01L 21/76832* (2013.01); *H01L 21/76834* (2013.01); *H01L 21/76879* (2013.01); *H01L 23/5283* (2013.01); *H01L 23/53233* (2013.01); *H01L 23/53238* (2013.01); *H01L 2223/6605* (2013.01)

(58) Field of Classification Search
CPC ......... H01L 2924/00; H01L 2924/0002; H01L 2924/00014; H01L 21/84; H01L 21/76254; H01L 2224/48091; H01L 27/1225; H01L 29/7869
See application file for complete search history.

(56) References Cited

U.S. PATENT DOCUMENTS

| 10,187,998 B2 | 1/2019 | Rawlings et al. |
| 2008/0029476 A1 | 2/2008 | Ohmi et al. |

(Continued)

OTHER PUBLICATIONS

Friedlein, et al., Bias-controlled, high-rate plasma deposition of dense and transparent silicon nitride films at substrate temperatures below 100° C., Proc. International Conference on Coatings on Glass and Plastics 12, Thin. Solid Films, 2018. 5 pages.

(Continued)

*Primary Examiner* — Tony Tran
(74) *Attorney, Agent, or Firm* — Schwabe, Williamson & Wyatt, P.C.

(57) ABSTRACT

Conductive structures in a microelectronic package and having a surface roughness of 50 nm or less are described. This surface roughness is from 2 to 4 times less than can be found in packages with conductive structures (e.g., traces) formed using alternative techniques. This reduced surface roughness has a number of benefits, which in some cases includes a reduction of insertion loss and improves a signal to noise ratio for high frequency computing applications. The reduced surface roughness can be accomplished by protecting the conductive structure r during etch processes and applying an adhesion promoting layer to the conductive structure.

16 Claims, 5 Drawing Sheets

(56) References Cited

U.S. PATENT DOCUMENTS

2016/0079560 A1\* 3/2016 Guimard ............ H01L 51/5237
                                                      257/40
2016/0343654 A1   11/2016 Kojima
2017/0278809 A1\* 9/2017 Huang .............. H01L 21/02334
2018/0297329 A1   10/2018 Kitai et al.
2018/0332720 A1   11/2018 Harkness, Jr. et al.

OTHER PUBLICATIONS

Extended European Search Report received for EP Application No. 20162887.2, dated Nov. 11, 2020. 8 pages.

\* cited by examiner

ETCH BARRIER FOR MICROELECTRONIC PACKAGING CONDUCTIVE STRUCTURES

BACKGROUND

For transmission line structures, power loss during transmission of an electrical signal can be due to (i) conductor loss and/or (ii) dielectric loss. Conductor loss is due in part to the bulk conductivity of the material used for the conductive structure. Another contribution to conductor loss is the surface roughness of the conductive structure itself. Surface roughness can be important in high frequency applications because electrical current can preferentially travel on the surface of a conductive structure at high frequencies. Conductive structures having more surface roughness thus have a higher effective resistivity and correspondingly higher signal loss.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are described for forming conductive structures in a microelectronics package substrate with a surface roughness of 50 nm or less. A conductive structure (e.g., a transmission line or a pad) in a package can be formed using a dose-selective dual development photoresist, in some embodiments. The conductive structure can be formed in a relatively narrow trench (e.g., conductive line) or hole (e.g., conductive pad) created by a first development of the dose-selective photoresist. A second development process can be used to widen the trench or hole to a second width greater than the first width, thus exposing lateral surfaces of the conductive structure. An etch selective layer (e.g., silicon nitride layer) can be formed over the conductive structure to improve adhesion with subsequently applied materials (e.g., insulator material). In this way, adhesion between a conductive structure and the subsequent material layer is encouraged without signal loss caused by a rough surface of the conductive structure.

General Overview

As indicated above, surface roughness of conductive structures in electronic package substrates can degrade the electrical conductivity of those structures. Generally, the rougher a surface of a transmission line, the higher the resistivity. In the context of a transmission line, this increased resistivity can cause an impedance mismatch with respect to the impedance of the source of the input signal being applied to the transmission line. Such an impedance mismatch can cause input signal loss (sometimes referred to as insertion loss). This effect increases with increasing signal frequency, thus impacting the performance of electronic devices such as mobile communication devices that transmit and receive at high frequencies (e.g., from the 500 megahertz (MHz) range to one or more gigahertz (GHz) range). However, in the context of a microelectronics package application, there are competing considerations with respect to surface roughness. For instance, conductive structures are often roughened to improve adhesion between the conductive structure and a subsequently added material (such as an encapsulating dielectric layer). For example, after the conductive structures are formed, they can be exposed to an appropriately composed etchant that can create the relatively jagged, irregular surface topography indicated in FIG. 1. For copper alloy conductive structures this etchant can be, for example, a dilute solution of hydrogen peroxide and sulfuric acid. In some techniques, surfaces of a conductive structure are intentionally roughened to include surface features having a depth of approximately 500 nm (+/−10%) to improve adhesion between the conductive structure (often copper or copper alloy) and the surrounding dielectric material. The surface roughness creates mechanical connection points between the conductive structure and the dielectric material of the electronic package. Even when intentional roughening of conductive structure is avoided (for example, by applying adhesion promoters to the conductive structure instead of roughening the surface of the conductive structure), the conductive structures often will still have a surface roughness of approximately ~100 nm (+/−10%). This surface roughness can be caused, for instance, by subsequent processing of the electronic package substrate. Thus, a tension remains between good adhesion (which favors surface roughness) and conductor resistance (which disfavors surface roughness).

Thus, techniques are described for forming conductive structures in an electronic package substrate with low surface roughness (e.g., approximately 50 nm (+/−10%) or less). In an embodiment, a conductive structure in a package is formed using a dose-selective dual development photoresist. The conductive structure can be formed, for instance, in a trench or hole created in a dose-selective photoresist by a first development, the trench or hole having a first width. A second development process can be used to widen the trench or hole to a second width greater than the first width, thus exposing lateral surfaces of the conductive structure. One or more layers can be formed on the conductive structures to protect the underlying conductive structure from subsequent etch processes, thus preventing surface roughening, while still improving adhesion with a subsequently applied materials (e.g., organic dielectric layer). In this way, adhesion between a conductive structure and the subsequently applied layer is maintained without roughening a surface of a conductive structure. Note that trench and hole may be used herein interchangeably. To this end, note that a trench may be elongated, such as for a transmission line or lengthy conductive run, or hole-like for a conductive pad. Thus, trench is intended to cover any number of conductive structures.

Materials that are "compositionally different" or "compositionally distinct" as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Figure 2:
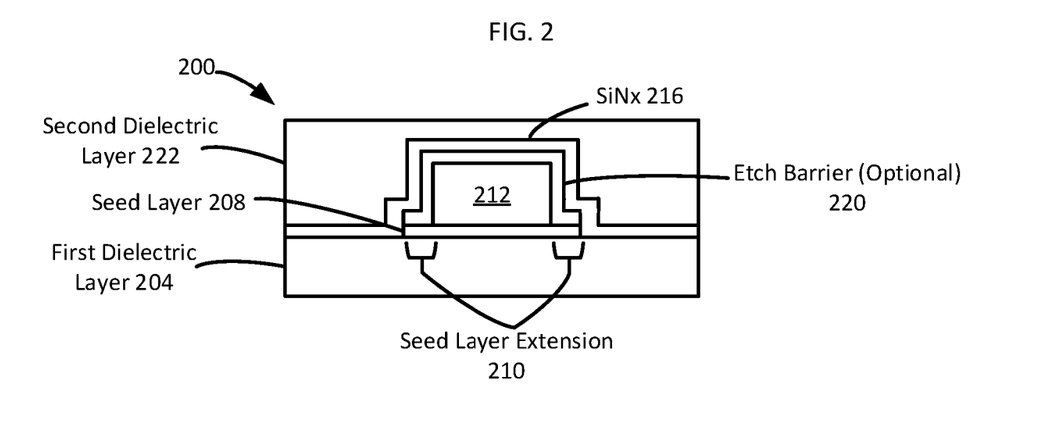
FIG. 2 is a cross-sectional view of a conductive structure within an electronic package substrate, the view taken perpendicular to a plane of the substrate, that includes an adhesion layer on the conductive structure to improve adhesion between a smooth surface of the conductive structure and a surrounding dielectric layer, in accordance with an embodiment of the present disclosure.

Methodology and Architecture FIG. 2 illustrates one example of a structure 200 that includes a conductor in an electronic package having a surface roughness of approximately 50 nm (+/−10%). The example structure 200 includes a first dielectric layer 204, a seed layer 208, a conductive structure 212, a silicon nitride (SiNx) layer 216, an optional etch barrier 220, and a second dielectric layer 222. In some embodiments, the seed layer 208 extends beyond the boundaries of the conductive structure 212. These seed layer extensions 210 can be present in some embodiments as a result of a sequence of the processes, which are described below in more detail. The example structure 200 can be formed using any of a number of techniques, some of which are illustrated in FIGS. 3A-3I.

Figure 1:
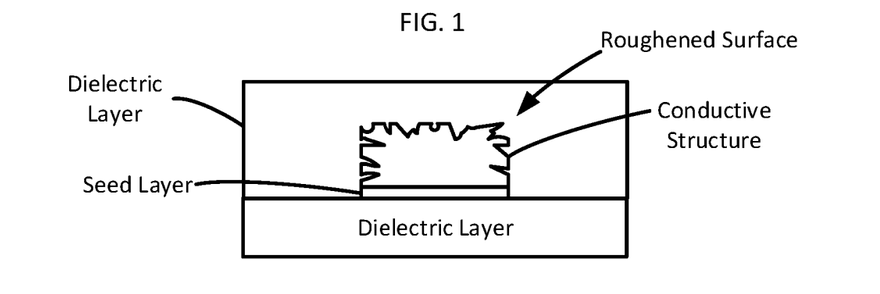
FIG. 1 is a cross-sectional view of a conductive structure within an electronic package substrate, the view taken perpendicular to a plane of the substrate, in which the surface of the conductive structure has been roughened to improve adhesion with a surrounding dielectric layer.

As can be seen, in contrast to the structure illustrated in FIG. 1, the conductive structure 212 depicted in FIG. 2 has a smooth surface (e.g., having a surface roughness of approximately 50 nm (+/−10%)). To improve adhesion between the smooth surface of the conductive structure 212 and the second dielectric layer 222 without the surface roughness shown in FIG. 1, a silicon nitride layer 216 is provided between the conductive structure 212 and the second dielectric layer 222. In this way, delamination of the second dielectric layer 222 from the conductive structure 212 can be eliminated or reduced while at the same time reducing transmission signal loss (i.e., insertion loss) that results from having a surface roughness in a conductive structure that is greater than 100 nm.

FIGS. 3A-3I illustrate cross-sectional views of an electronic package substrate (taken perpendicular to a plane of the substrate) that includes a conductive structure coated by a silicon nitride (SiN$_x$) layer, in accordance with some embodiments. The SiN$_x$ layer improves adhesion between a smooth surface of the conductive structure and a surrounding substrate dielectric layer. The SiN$_x$ layer can also help protect the conductive structure from subsequent processes that would increase surface roughness and therefore also increase insertion loss.

Figure 3A:
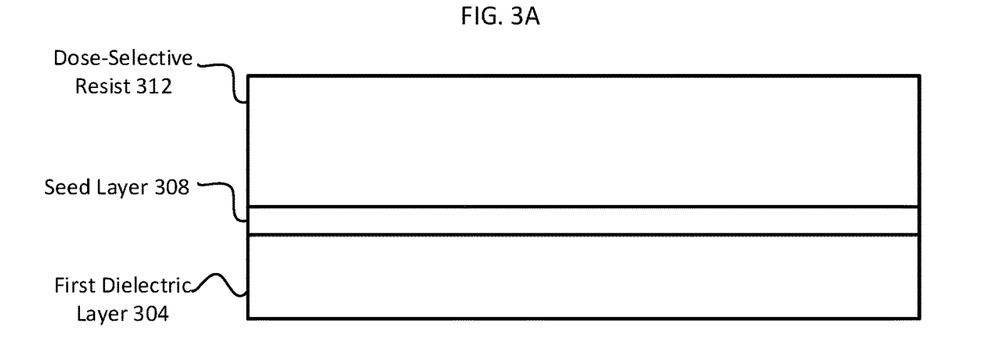
FIGS. 3A-3I illustrate cross-sectional views of an electronic package substrate (taken perpendicular to a plane of the substrate) that includes a conductive structure covered by a silicon nitride ($SiN_x$) layer, in accordance with an embodiment of the present disclosure.

Turning to FIG. 3A, processing can begin be providing a first dielectric layer 304 that is covered with a conductive seed layer 308. A photoresist layer 312 can then formed on the seed layer 308.

The first dielectric layer 304 can be composed of organic dielectric materials. The first dielectric layer 304 can be formed from an organic resin, such as an epoxy or other polymerizable resin (e.g., network polymer components, thermosetting polymer components, thermoplastic polymer components). Other materials can be added to the organic resin to promote hardening (e.g., via polymerization) such as polymer reaction initiators or hardeners. In some cases, filler materials can be added to the resin prior to hardening to alter the mechanical and/or electrical properties of the dielectric layer 304. Example materials include micron sized and/or nano-sized $SiO_2$ particles, among others.

The seed layer 308 can then be formed on the first dielectric layer 304. The seed layer 308 can be used in subsequent processes, described below, for the electrolytic formation of conductive structures of the electronic package substrate. In some examples, the seed layer 308 can be composed of a conductive material (e.g., copper, copper alloy, copper and titanium multilayer structures). Techniques for forming the seed layer 308 include electroless deposition, and physical vapor deposition (PVD, also known as sputtering).

A dose-selective photoresist layer 312 is then formed on the seed layer 308. The dose-selective photoresist layer 312 can develop at different rates when different regions of the layer 312 are exposed to different wavelengths of radiation, different intensities, or different dosages (i.e., exposure time). Examples of materials that can be formulated to be dose-selective include polymers that include photo-acid or photo-base generators, or photosensitizers. This allows for the patterning of multiple images using a single photoimaging process.

The dose-selective photoresist layer 312 can be applied to the first dielectric layer 304 and seed layer 308 as a solid coating or by laminating a dry film on the seed layer 308 over the dielectric layer 304. It will be appreciated that in other embodiments, a non-dose-selective photoresist can be used in combination with multiple lithography processes and/or lithographic masks to control the progressive formation of the trenches and various layers, as described herein.

Figure 3B:
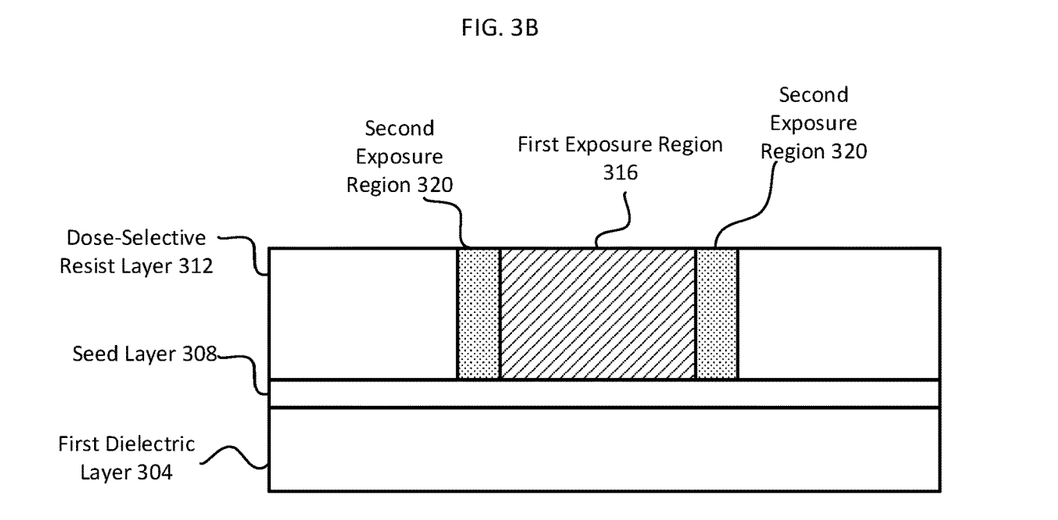

Turning to FIG. 3B, the dose-selective photoresist layer 312 is exposed at two different radiation dosage levels, intensities, dosages, and/or wavelengths to form a first exposure region 316 and a second exposure region 320. Due to the different exposure levels, the first exposure region 316 and the second exposure region 320 can be removed independently from one another in separate development processes. As mentioned above, alternatively a single dose photoresist layer can be exposed and developed in multiple processes to form the first exposure region 316 and the second exposure region 320.

Figure 3C:
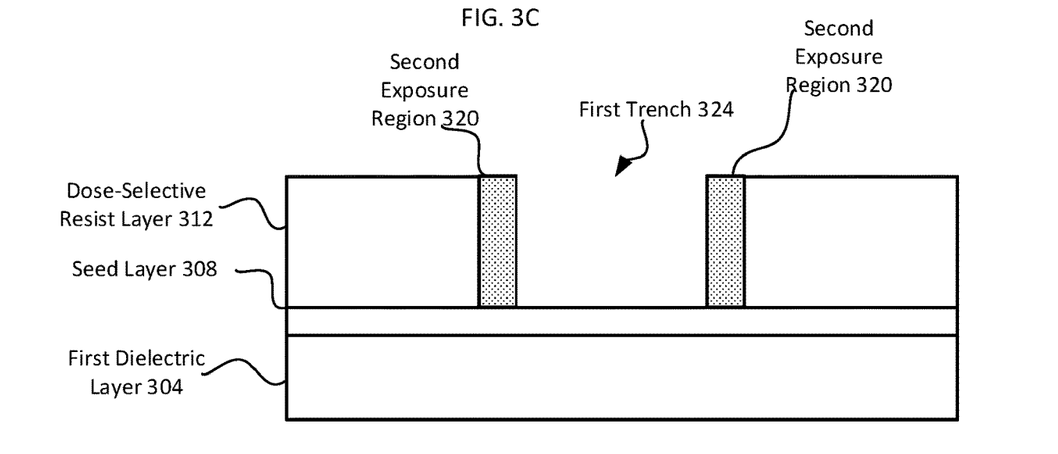

Regardless of the photoresist type and lithography process used, a first stage of the resulting structure is shown in FIG. 3C. The first exposure region 316 has been developed (that is, removed) by a first development process that leaves second exposure regions 320 temporarily in place over the seed layer 308. The seed layer 308 is exposed at the bottom of a first trench 324 that forms upon development of the first exposure region.

Figure 3D:
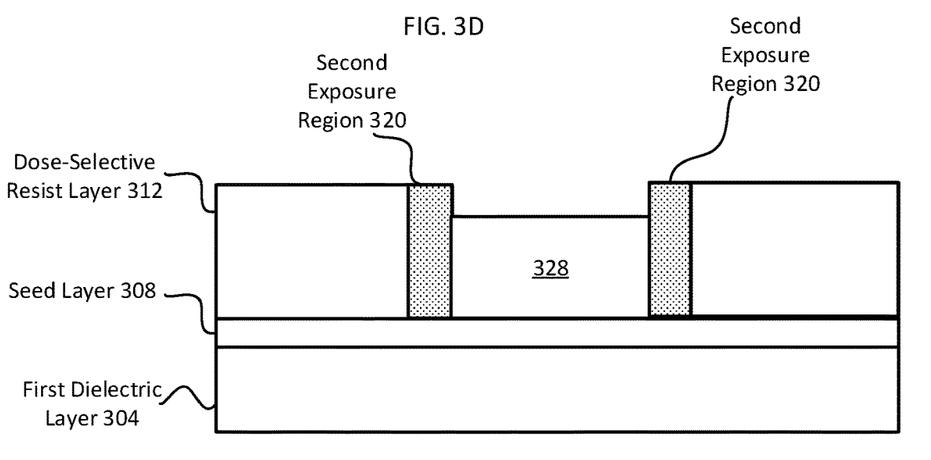

Turning to FIG. 3D, a conductive structure 328 can then be formed in the first trench 324 on the exposed portion of the seed layer 308. This conductive structure 328 corresponds to the conductive structure 212 shown in FIG. 2. Examples of conductive structures 328 include conductive transmission lines (i.e., traces) and/or pads. The conductive structure 328 can be formed by an electrolytic deposition process that uses the exposed portion of the seed layer 308 to nucleate and form the conductive structure 328 within the first trench 324.

Figure 3E:
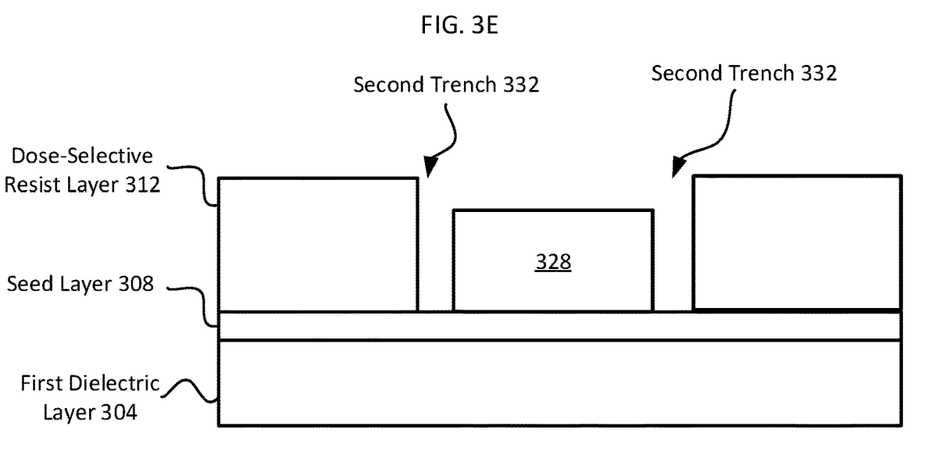

The second exposure region 320 can then be developed after formation of the conductive structure 328. As shown in FIG. 3E, this development removes the second exposure regions 320, leaving second trenches 332 on opposing sides of the conductive structure 328. It will be appreciated that in some examples, the second trench 332 can be a single continuous trench (e.g., an annulus surrounding a conductive structure 328 that has a circular plan view cross-sectional profile) as well as parallel trenches (e.g., on either side of a trace having a rectangular cross-section and a longitudinal axis).

Figure 3F:
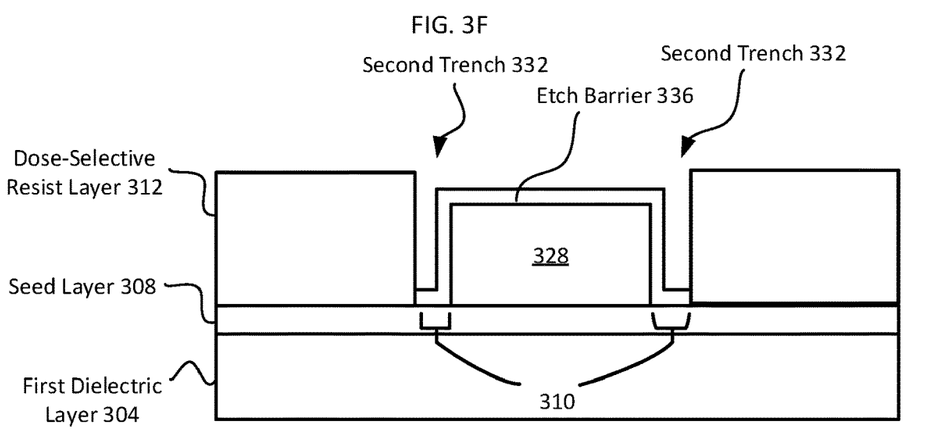

Illustrated in FIG. 3F, an etch barrier layer 336 can, in some embodiments, be formed over, and in some cases in direct contact with, the conductive structure 328. The etch barrier layer 336 may also optionally be formed over, and in some cases in direct contact with, the portion(s) of the seed layer 308 extending beyond a perimeter of the conductor 328 and exposed by formation of the second trench 332. This can produce seed layer portions 310 extending beyond the width of the conductive structure 328.

The etch barrier layer 336, which may be a copper corrosion inhibitor (or simply an inhibitor) in some embodiments where conductor structure 328 is copper or a copper alloy, can be provided to protect the underlying conductive structure 328 from subsequent processes that might cause the surface to roughen. As indicated above, even a surface roughness of 100 nm or more can cause degradation in signal integrity. Provisioning of the etch barrier layer 336 can help prevent even low levels of surface roughening that may unintentionally occur in some processes.

Example compositions of the etch barrier layer 336 can include organic compositions as well as inorganic compositions. Examples of organic etch barrier layers 336 can include those based on amino acids, amines, azoles, Schiff bases, carboxylic acids, ionic liquids, and self-assembling monolayer compositions (e.g., organothiols such as n-dodecanethiol). Examples of inorganic etch barrier layers 336 can include compositions that include one of chromium, boron, and molybdenum. Specific examples include chromate ($CrO_4^{2-}$), molybdate ($MoO_4^{2-}$), and tetraborate ($B_4O_7^{2-}$). In some cases, these inorganic compounds can be applied as a 0.033 Molar solution in lithium bromide (LiBr) and having a pH of 6.9. In some examples, the etch barrier layer 336 can be a thin (e.g., monolayer, 1 nm-2 nm; 2 nm-5 nm) layer a metal, or metal alloy that has an etch rate that is slower than the etch rate of copper. Regardless of the composition, the etch barrier layer 336 can be chosen so as to selectively form on the seed layer 308 and the conductive structure 328. With this selectivity, the etch barrier 336 protects the seed layer 308 and conductive structure 328 from being corroded or from the surface of these structures being roughened during development (i.e., removal) of the remaining portions of photoresist 312. In some examples, the etch barrier layer 336 may not be detectable as a distinct layer using traditional microscopy techniques (e.g., transmission electron microscopy). However, in some cases, some of the elements used to form the etch barrier layer compositions may be detectable (e.g., via XPS, SIMS, or other composition characterization technique).

Figure 3G:
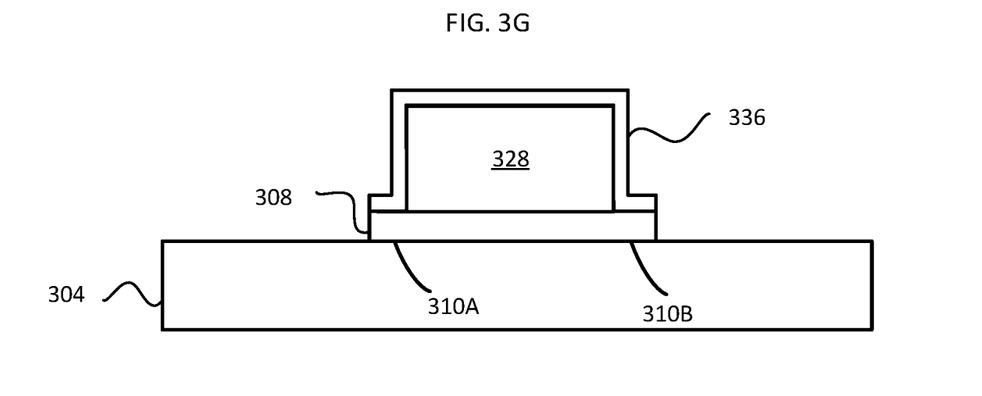

As shown in FIG. 3G, after application of the etch barrier layer 336 on the exposed surfaces of the seed layer 308 and the conductive structure 328, the remaining portions of the dose-selective photo resist 312 are stripped or otherwise removed. An etch, such as a solution of hydrogen peroxide and sulfuric acid can then be applied so as to remove the exposed portions of the copper seed layer 308 not otherwise protected by the etch barrier layer 336. Note that such an etchant is selective to the etch barrier layer 336 (meaning that that the etch barrier layer 336 etches much more slowly than does the seed layer 308, in response to the etchant. This selective etch process electrically isolates the various conductive structures 328 from one another (only one of which is shown) by removing exposed portions of the seed layer 308 that could otherwise electrically short conductive structures.

The etch barrier layer 336 protects the conductive structure 328 from being roughened during exposure to this etch. This preserves the surface topography of the as-formed conductive structure, which can have an root mean square feature size of 50 nm or less (as indicated by an average root means square feature size measured by atomic force microscopy (AFM)). In some examples, the etch barrier layer 336 may not be present or alternatively may be present but not detectable because of the nature of the composition or the reduced thickness of the etch barrier layer 336 after application of the etch.

As shown in FIG. 3G, in some examples the seed layer 308 extensions 310A, 310B extend beyond the width of the conductive structure 328. In some examples, the extensions 310A, 310B can extend from 1 microns (μm) to 5 μm beyond the width of the conductive structure 328. In other examples, the extensions 310A, 310B can extend any convenient distance beyond the boundary of the conductive structure that does not risk contact with adjacent conductive structures (e.g., the extensions 310A, 310B are separated from an adjacent conductive structure by at least 5 or at least 10 μm).

Figure 3H:
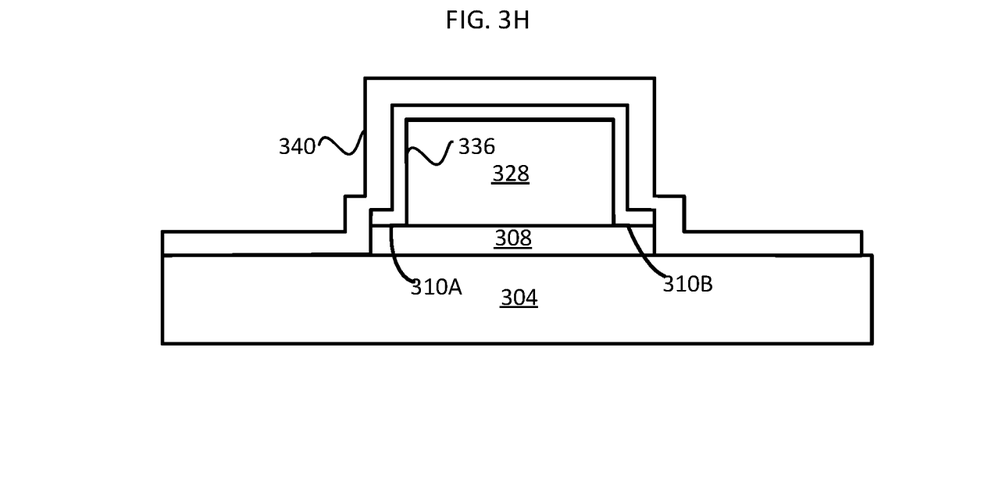
Figure 3I:
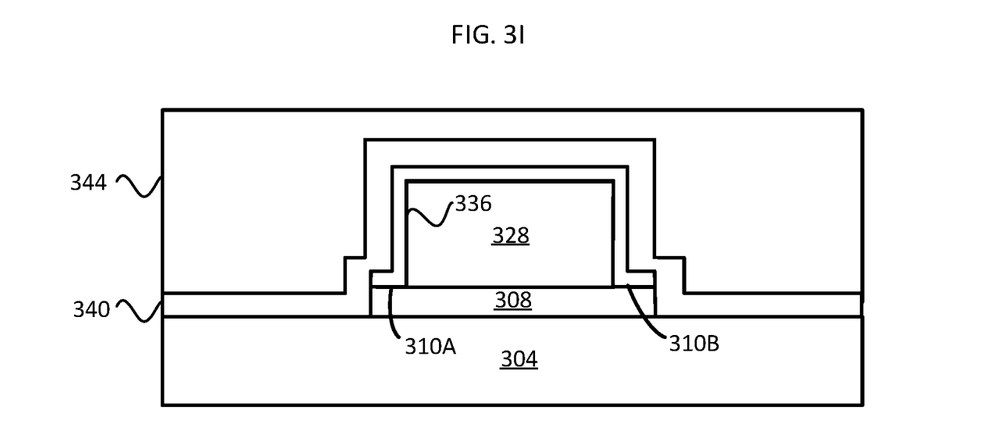

As indicated above, conductive structures 328 (often formed from copper or alloys of copper) do not adhere well to organic dielectric layers that can be used to form packaging substrates. To promote adhesion between the conductive structure and a dielectric layer applied thereto, an adhesion promoting film 340 can be formed on the conductive structure 328, as shown in FIG. 3H. In some examples, the adhesion promoting film can include silicon and one or more of nitrogen, carbon, and oxygen. In some other examples, the adhesion promoting film 340 can include commercially available organic compounds designed to improve adhesive strength between a conductive structure and a surrounding dielectric layer, such as those available from Shikoku Chemicals Corporation. In some examples, the adhesion promoting film 340 can be formed using chemical vapor deposition (CVD), pressure assisted chemical vapor deposition (PECVD), physical vapor deposition (PVD), plasma deposition processes, and spin-on coating, among others.

Example System

Figure 4:
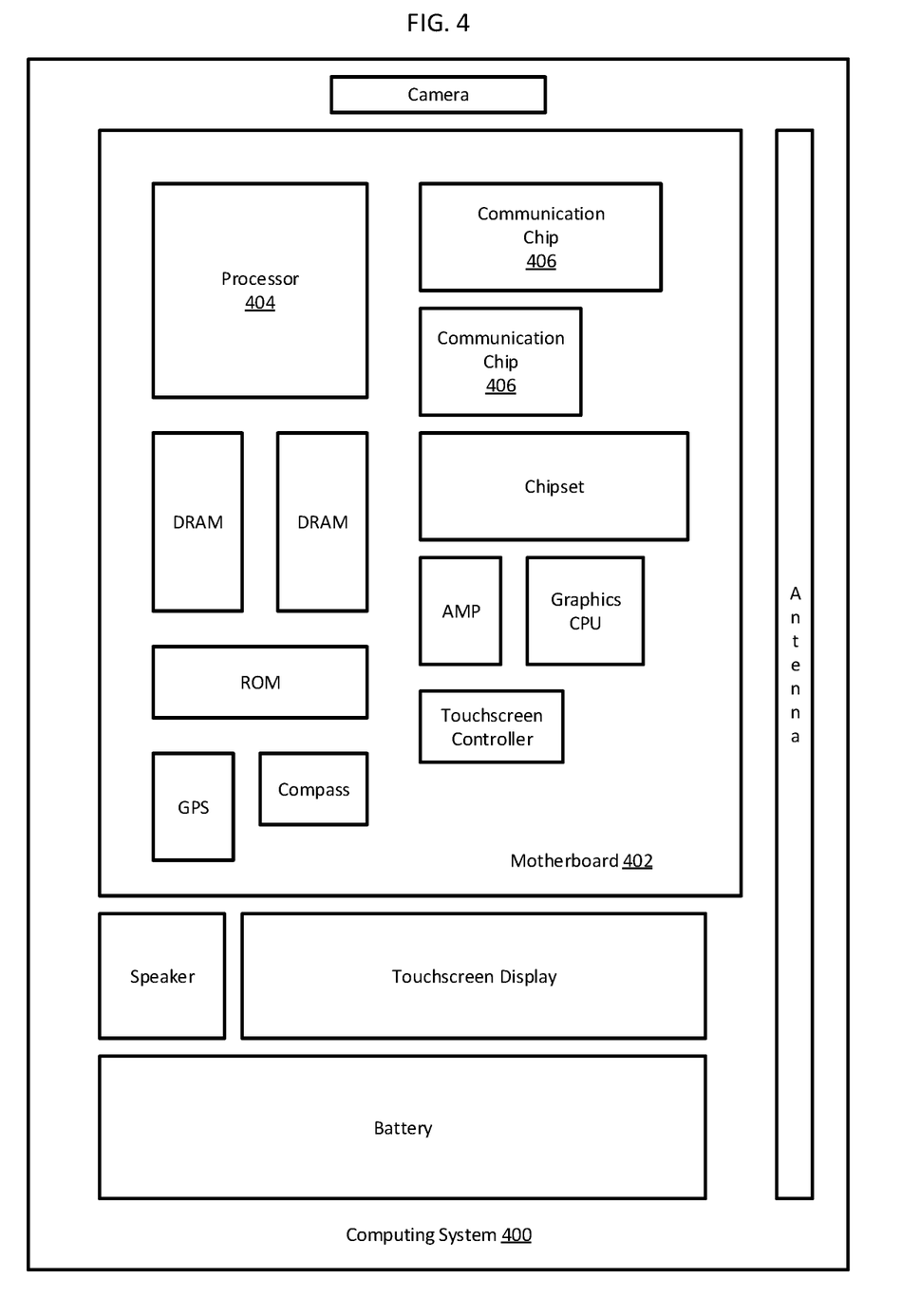
FIG. 4 illustrates a computing system including one or more of the integrated circuit structures formed on a substrate, as variously described herein, in accordance with an embodiment of the present disclosure.

FIG. 4 is an example computing system implemented with one or more of the integrated circuit structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment (e.g., an electronic package substrate that includes conductive structures covered by a $SiN_x$ layer and having surface features of 50 nm or less, as variously provided herein). In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others. In some embodiments, communication chip 406 may include one or more transistor structures having a gate stack an access region polarization layer as variously described herein.

The processor 404 of the computing system 400 includes an integrated circuit die packaged within the processor 404. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit package comprising: a first layer comprising a dielectric material; a structure comprising a conductive material over the first layer, wherein the structure comprises a surface roughness of 50 nm or less; a second layer over the structure, the second layer compositionally distinct from the first layer; and a third layer over the first layer, the structure, and the second layer, the third layer comprising the dielectric material and compositionally distinct from the second layer.

Example 2 includes the subject matter of Example 1, wherein the structure includes a first portion having a first width and a second portion having a second width that is wider than the first width.

Example 3 includes the subject matter of Example 1 or 2, wherein the first portion is compositionally distinct from the second portion.

Example 4 includes the subject matter of Example 1 or 2, wherein the first portion and the second portion both comprise copper.

Example 5 includes the subject matter of any of the preceding Examples, wherein the second width of the second portion is 2 μm to 10 μm wider than the first width of the first portion.

Example 6 includes the subject matter of any of the preceding Examples, wherein the second portion extends laterally beyond a first side of the first portion by 1 μm to 5 μm, and wherein the second portion extends laterally beyond a second side of the first portion by 1 μm to 5 μm.

Example 7 includes the subject matter of any of the preceding Examples, further comprising a fourth layer on the first portion of the structure and on the second portion of the structure extending beyond the first portion, the fourth layer compositionally distinct from the third layer.

Example 8 includes the subject matter of any of the preceding Examples, wherein the fourth layer comprises oxygen and one of chromium, boron, and molybdenum.

Example 9 includes the subject matter of any of the preceding Examples, wherein the second layer comprises silicon and one or more of nitrogen, carbon, and oxygen.

Example 10 includes the subject matter of any of preceding Examples, wherein the structure comprises a copper alloy transmission line.

Example 11 includes the subject matter of any of Examples 1-9, wherein the structure comprises a copper alloy pad.

Example 12 is a printed circuit board that includes the subject matter of any of the preceding Examples.

Example 13 is an electronic system that includes the subject matter of any of the preceding Examples.

Example 14 is an integrated circuit package comprising: a first layer comprising a dielectric material; a structure comprising a conductive material over the first layer, wherein the structure includes a first portion having a first width and a second portion having a second width that is wider than the first width by at least 1 µm, wherein the first portion of the structure comprises a surface roughness of 50 nm or less; a second layer over the structure, the second layer comprising silicon and one or nitrogen, carbon, and oxygen; and a third layer over the first layer, the structure, and the second layer, the third layer comprising the dielectric material and being compositionally distinct from the second layer.

Example 15 includes the subject matter of Example 14, wherein the first and second portions of the structure comprise a metal, and the second width of the structure is at least 4 wider than the first width of the structure.

Example 16 includes the subject matter of either of Examples 14 or 15, wherein the structure comprises a copper alloy transmission line.

Example 17 includes the subject matter of any of Examples 14 or 15, wherein the structure comprises a copper alloy pad.

Example 18 includes the subject matter of any of Examples 14-17, further comprising a fifth layer comprising the dielectric material over the first, second, and third layers, and over the structure.

Example 19 is a printed circuit board that includes the subject matter of any of Examples 14-18.

Example 20 is an electronic system that includes the subject matter of any of the Examples 14-19.

Example 21 is an integrated circuit package substrate comprising: a first layer comprising a dielectric material; a first structure having a first width, the first structure comprising a first conductive material over the first layer; a second structure between the first layer and the first structure comprising a second conductive material, the second structure having a second width greater than the first width; a second layer over the second structure and the first structure, the second layer compositionally distinct from the first layer; and a third layer over the first layer, the first structure, the second structure, and the second layer, the third layer comprising the dielectric material and being compositionally distinct from the second layer.

Example 22 includes the subject matter of Example 21, wherein the first structure comprises a surface roughness of 50 nm or less.

Example 23 includes the subject matter of either of Examples 21 or 22, wherein the first structure and the second structure are compositionally distinct.

Example 24 includes the subject matter of any of Examples 21 or 22, wherein the first structure and the second structure both comprise copper.

Example 25 includes the subject matter of any of Examples 21-24, wherein the second width is at least 2 µm wider than the first width.

Example 26 includes the subject matter of any of Examples 21-25, further comprising a fifth layer comprising the dielectric material over the first, second, and third layers, and over the first structure and the second structure.

Example 27 is a printed circuit board that includes the subject matter of any of Examples 21-26.

Example 28 is an electronic system that includes the subject matter of any of Examples 21-27.

What is claimed is:

1. An integrated circuit package comprising:
a first layer comprising a dielectric material;
a structure comprising a conductive material over the first layer, wherein the structure comprises a surface roughness of 50 nm or less;
a second layer over the structure, the second layer compositionally distinct from the first layer, wherein the second layer is a single layer conformal with the structure, and wherein the second layer has an uppermost surface above an uppermost surface of the structure;
a third layer over the first layer, the structure, and the second layer, the third layer comprising the dielectric material and compositionally distinct from the second layer;
wherein the structure includes a first portion having a first width and a second portion having a second width that is wider than the first width;
wherein the second portion extends laterally beyond a first side of the first portion by 1 µm to 5 µm, and wherein the second portion extends laterally beyond a second side of the first portion by 1 µm to 5 µm; and
wherein the second layer comprises silicon and one or more of nitrogen, carbon, and oxygen.

2. The integrated circuit package of claim 1, wherein the second width of the second portion is 2 µm to 10 µm wider than the first width of the first portion.

3. The integrated circuit package of claim 1, wherein the structure comprises a copper alloy transmission line.

4. The integrated circuit package of claim 1, wherein the structure comprises a copper alloy pad.

5. A printed circuit board comprising the integrated circuit package of claim 1.

6. An electronic system comprising the integrated circuit package of claim 1.

7. An integrated circuit package comprising:
a first layer comprising a dielectric material;
a structure comprising a conductive material over the first layer, wherein the structure includes a first portion having a first width and a second portion having a second width that is wider than the first width by at least 1 µm, wherein the first portion of the structure comprises a surface roughness of 50 nm or less;
a second layer over the structure, the second layer comprising silicon and one or more of nitrogen, carbon, and oxygen, wherein the second layer is a single layer conformal with the structure, and wherein the second layer has an uppermost surface above an uppermost surface of the structure;
a third layer over the first layer, the structure, and the second layer, the third layer comprising the dielectric material and being compositionally distinct from the second layer;

wherein the structure includes a first portion having a first width and a second portion having a second width that is wider than the first width; and wherein the second portion extends laterally beyond a first side of the first portion by 1 µm to 5 µm, and wherein the second portion extends laterally beyond a second side of the first portion by 1 µm to 5 µm.

8. The integrated circuit package of claim 7, wherein the first and second portions of the structure comprise a metal, and the second width of the structure is at least 4 µm wider than the first width of the structure.

9. The integrated circuit package of claim 7, wherein the structure comprises a copper alloy transmission line.

10. The integrated circuit package of claim 7, further comprising a fifth layer comprising the dielectric material over the first, second, and third layers, and over the structure.

11. A printed circuit board comprising the integrated circuit package of claim 7.

12. An electronic system comprising the integrated circuit package of claim 7.

13. An integrated circuit package substrate comprising:
a first layer comprising a dielectric material;
a first structure having a first width, the first structure comprising a first conductive material over the first layer; wherein the first structure comprises a surface roughness of 50 nm or less;
a second structure between the first layer and the first structure comprising a second conductive material, the second structure having a second width greater than the first width;
a second layer over the second structure and the first structure, the second layer compositionally distinct from the first layer, wherein the second layer is a single layer conformal with the first structure, and wherein the second layer has an uppermost surface above an uppermost surface of the first structure;
a third layer over the first layer, the first structure, the second structure, and the second layer, the third layer comprising the dielectric material and being compositionally distinct from the second layer;
wherein the structure includes a first portion having a first width and a second portion having a second width that is wider than the first width;
wherein the second portion extends laterally beyond a first side of the first portion by 1 µm to 5 µm, and wherein the second portion extends laterally beyond a second side of the first portion by 1 µm to 5 µm; and
wherein the second layer comprises silicon and one or more of nitrogen, carbon, and oxygen.

14. The integrated circuit package substrate of claim 13, wherein the second width is at least 2 µm wider than the first width.

15. The integrated circuit package substrate of claim 13, further comprising a fifth layer comprising the dielectric material over the first, second, and third layers, and over the first structure and the second structure.

16. A printed circuit board comprising the integrated circuit package substrate of claim 13.

* * * * *